United States Patent
Farooq et al.

(10) Patent No.: US 8,288,270 B2
(45) Date of Patent: Oct. 16, 2012

(54) ENHANCED ELECTROMIGRATION RESISTANCE IN TSV STRUCTURE AND DESIGN

(75) Inventors: Mukta G Farooq, Hopewell Junction, NY (US); John A Griesemer, Salt Point, NY (US); Gary LaFontant, Elmont, NY (US); William Francis Landers, Wappingers Falls, NY (US); Timothy Dooling Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/397,004

(22) Filed: Feb. 15, 2012

(65) Prior Publication Data

US 2012/0199983 A1 Aug. 9, 2012

Related U.S. Application Data

(62) Division of application No. 13/023,743, filed on Feb. 9, 2011.

(51) Int. Cl.
*H01L 21/4763* (2006.01)

(52) U.S. Cl. .................................... 438/629; 438/927

(58) Field of Classification Search .............. 438/927, 438/629
See application file for complete search history.

(56) References Cited

U.S. PATENT DOCUMENTS

| | | |
|---|---|---|
| 6,500,749 B1 | 12/2002 | Liu et al. |
| 6,859,916 B1 | 2/2005 | Teig et al. |
| 6,882,055 B1 | 4/2005 | Teig et al. |
| 6,895,569 B1 | 5/2005 | Teig et al. |
| 6,976,238 B1 | 12/2005 | Teig et al. |
| 7,115,502 B2 | 10/2006 | Jan |
| 7,205,667 B2 | 4/2007 | Koura et al. |
| 7,263,677 B1 | 8/2007 | Teig et al. |
| 7,310,793 B1 | 12/2007 | Teig et al. |
| 7,906,431 B2 | 3/2011 | Mistuhashi |

(Continued)

FOREIGN PATENT DOCUMENTS

JP 2003257973 A 9/2003

(Continued)

OTHER PUBLICATIONS

Weide, K. and Hasse, W. "3-dimensional simulations of temperature and current density distribution in a via structure," Reliability Physics Symposium 1992. 30th Annual Proceedings, pp. 361-365, 1992.

(Continued)

*Primary Examiner* — Douglas Menz
(74) *Attorney, Agent, or Firm* — Jason H. Sosa; Katherine S. Brown

(57) ABSTRACT

The embodiments provide a method for reducing electromigration in a circuit containing a through-silicon via (TSV) and the resulting novel structure for the TSV. A TSV is formed through a semiconductor substrate. A first end of the TSV connects to a first metallization layer on a device side of the semiconductor substrate. A second end of the TSV connects to a second metallization layer on a grind side of the semiconductor substrate. A first flat edge is created on the first end of the TSV at the intersection of the first end of the TSV and the first metallization layer. A second flat edge is created on the second end of the TSV at the intersection of the second end of the TSV and the second metallization layer. On top of the first end a metal contact grid is placed, having less than eighty percent metal coverage.

7 Claims, 5 Drawing Sheets

U.S. PATENT DOCUMENTS

2007/0284748 A1     12/2007     Woo et al.

FOREIGN PATENT DOCUMENTS

JP            2003318260 A     11/2003

OTHER PUBLICATIONS

Non Final Office Action (Requirement for Restriction/Election) for U.S. Appl. No. 13/023,743, dated Feb. 3, 2012.

Response to Non Final Office Action (Requirement for Restriction/Election) for U.S. Appl. No. 13/023,743, dated Feb. 9, 2012, filed Feb. 14, 2012.

Non Final Office Action for U.S. Appl. No. 13/023,743, dated Mar. 2, 2012.

Response to Non Final Office Action for U.S. Appl. No. 13/023,743, dated Apr. 3, 2012, filed Apr. 16, 2012.

Notice of Allowance for U.S. Appl. No. 13/023,743, dated May 2, 2012.

ENHANCED ELECTROMIGRATION RESISTANCE IN TSV STRUCTURE AND DESIGN

CROSS REFERENCE TO RELATED APPLICATIONS

This application is a divisional of application Ser. No. 13/023,743, filed on Feb. 9, 2011, now pending.

BACKGROUND

The disclosure relates generally to three dimensional silicon integration structures and more specifically to design and layout of through-silicon via (TSV) structures allowing for enhanced electromigration resistance.

In semiconductor technologies, a through-silicon via, also known as a through-substrate via, is a conductive feature formed in a semiconductor substrate (wafer or die). The TSV feature vertically passes through the semiconductor substrate, providing a stacked wafer/die packaging method and allowing electrical connection between circuits in separate wafers or chips.

There are a number of ways to create a TSV. Typically, a hole is etched into the semiconductor substrate, and sometimes through the interconnect structure as well. The hole may then be lined with various isolating layers and/or various metal layers. The hole is then filled with the conductive material, typically copper (Cu), which becomes the major part of a TSV. Some TSVs are in electrical contact with the semiconductor substrate, while others are electrically isolated. Any material within the etched hole may be considered part of the TSV, so the complete TSV may include the Cu, plus a liner, and perhaps insulating layers. Initially, the hole does not extend through the complete depth of the wafer. One side of the wafer is then subject to a thinning process (e.g. mechanical grinding, chemical-mechanical-polishing (CMP), or chemical or plasma etching) until the conductive metal of the TSV extends all the way through the semiconductor substrate. This side of the semiconductor substrate may be referred to as the grind side. The opposite side, where devices and the interconnect structure are located, may be referred to as the device side.

A metallization layer is wiring embedded in a dielectric material. Multiple metallization layers are often put together and interconnected through conventional vias. These layers together may be called the interconnect structure, or the Back End of Line (BEOL) wiring levels. Though a conventional via shares some similarity of name with a through-silicon via, it is a substantially different structure bearing little relationship. A conventional via connects wires within the interconnect structure and may only pass through a single dielectric layer. Conventional vias are on the order of the sizes of the metal lines to which they connect, generally within a factor of three to four times the thickness in the worst case. A TSV, having to pass through an entire semiconductor substrate, may be as much as thirty times larger in diameter than the conventional via. This has the effect of necessitating that, when connecting circuits on one chip or wafer to another chip or wafer, extremely thin wires in a metallization layer must connect to the much larger TSV structure. The size of the TSV also allows for fidelity of shape. Because the diameter of minimum-sized conventional vias is at the limits of photolithographic resolution, shapes given to conventional vias end up essentially round. However, due to the greater shape fidelity of the TSV, surfaces, angles and edges in the design can be preserved in the shapes built into the wafer.

Electromigration can take place in any conductive material carrying a current, such as a TSV structure or a metallization layer. Electromigration is the transport of material caused by the gradual movement of ions in a conductor. This transport of material may eventually cause a gap, or a void, in the conductive material leading to higher resistance at other connection points, or an open circuit failure when all connection is lost. To reduce the occurrence of such voids, there are rules limiting the amount of current allowed in a conductive material. Such electromigration ground rules are well known within the art.

SUMMARY

The different illustrative embodiments provide a method for reducing electromigration in a circuit containing a through-silicon via (TSV). The method begins with a TSV being formed in a manner so that it passes vertically through a semiconductor substrate, wherein a first end of the TSV connects to a first metallization layer on a device side of the semiconductor substrate, and wherein a second end of the TSV connects to a second metallization layer on a grind side of the semiconductor substrate. A first flat edge is created on a cross-section the first end of the TSV at the intersection of the first end of the TSV and the first metallization layer. A second flat edge is created on a cross-section of the second end of the TSV at the intersection of the second end of the TSV and the second metallization layer. The TSV is positioned such that a wire in the first metallization layer intersects orthogonally with the first flat edge.

The embodiments also provide a structure for a TSV for use in a semiconductor substrate. The TSV structure comprises a first end of the TSV connected to a first metallization layer on a device side of the semiconductor substrate. The TSV structure further comprises a second end of the TSV connected to a second metallization layer on a grind side of the semiconductor substrate. The TSV further comprises a first flat edge on a cross-section of the first end of the TSV at the intersection of the first end of the TSV and the first metallization layer and a second flat edge on a cross-section of the second end of the TSV at the intersection of the second end of the TSV and the second metallization layer. The TSV is positioned such that a wire in the first metallization layer intersects orthogonally with the first flat edge.

An illustrative embodiment also provides a system for reducing electromigration in a circuit containing TSVs. The system comprises one or more semiconductor substrates, each semiconductor substrate having a device side and a grind side. Each semiconductor substrate connects to an interconnect structure comprising one or more metallization layers. One or more TSVs pass through the one or more semiconductor substrates. At least one of the one or more TSVs comprises a first end connected to a first metallization layer from the one or more metallization layers on a device side of one of the one or more semiconductor substrates. A second end connects to a second metallization layer from the one or more metallization layers on a grind side of the one semiconductor substrate. A first flat edge is on a cross-section of the first end at the intersection of the first end and the first metallization layer. A second flat edge is on a cross-section of the second end at the intersection of the second end and the second metallization layer. The TSV is positioned such that a wire in the first metallization layer intersects orthogonally with the first flat edge.

DETAILED DESCRIPTION

Figure 1:
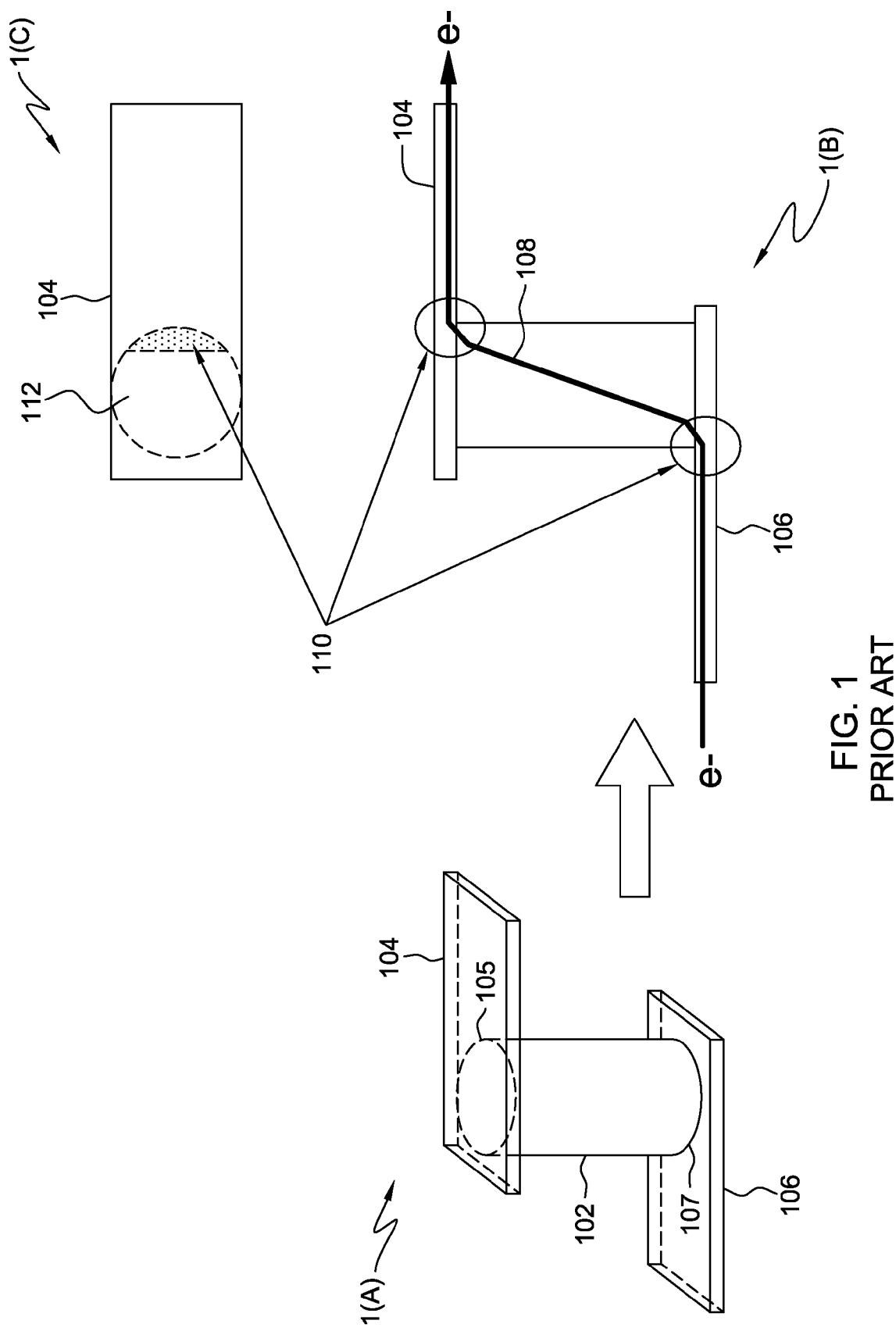
FIG. 1(A) is an illustration of a traditional through-silicon via (TSV) geometry from a three dimensional view.
FIG. 1(B) is an illustration of a traditional through-silicon via (TSV) geometry from a two dimensional side view.
FIG. 1(C) is an illustration of a traditional through-silicon via (TSV) geometry from a top view.

FIG. 1 depicts a traditional through-silicon via (TSV) geometry from different views. 1(A) shows a three dimensional view, 1(B) shows a two dimensional side view of the same geometry, and 1(C) shows a top view. TSV 102 is a cylindrical structure formed of a conductive material and passing through a semiconductor substrate (not shown). A circular cross section 112 of TSV 102 will not necessarily be a perfect circle, but may be made up of many small flat edges. Etching is typically used to round out sharp corners that may increase stresses in the geometry. TSV 102 has substantially planar end portions 105 and 107.

TSV 102 contacts metallization layers 104 and 106 (also called metal layers) on end portions 105 and 107. TSV 102 contacts metallization layers 104 and 106 in order to transmit power or signals. Metallization layers 104 and 106 may contact the end portions 105 and 107 of TSV 102 from any direction and may have varying thicknesses and widths. Where TSV 102 is not aligned with a current source from another chip or from the connecting substrate, metallization layers 104 and 106 are one or more relatively thin, flat metal wires disposed generally at right angles to the axis of TSV 102. "Thin" is relative to the dimensions of the semiconductor wafer. Where a silicon wafer or similar semiconductor wafer might be fifty to eighty micrometers thick (µm), the wiring features of metallization layers 104 and 106 may be on the order of single micrometers or smaller.

By connecting metallization layers 104 and 106 to the end portions 105 and 107 of TSV 102 current 108 may flow from metal layer 106, through TSV 102, and into metal layer 104. The thickness of the semiconductor dictates that TSV 102 be relatively wide in comparison to wiring features in use, amounting to a large via contacting a very thin line. This is unique to TSV geometry, as depicted in FIG. 1. TSV 102 has a cross-section much larger than wires in the metallization layers 104 and 106 and hence will have a much lower resistance. Due to the lower resistance, even though current density may be uniform at a distance from TSV 102, due to the convex perimeter of cross section shape of TSV 102, the current 108 flowing in from the wire, or wires, in metallization layer 106 will crowd into the center of the line in order to reach the leading edge of the much lower resistance TSV 102.

The same will happen on the opposite end as current 108 flows out of the leading edge of TSV 102 and into metallization layer 104. In FIG. 1 current crowding as described is depicted in regions 110.

Although TSV 102 can carry a large amount of current 108 due to its much larger cross-sectional area, the attached wires in metallization layers 104 and 106 are restricted by electromigration ground rules to a smaller amount of current 108 so as to avoid gaps in conductive material. Current crowding in regions 110 is likely to exceed the current density value allowed and electromigration damage may occur before the end of the semiconductor's life.

Current crowding of this nature is much less evident in via and metal wire contact points within the interconnect structure. Hence, illustrative embodiments provide for TSV structures that mitigate electromigration concerns.

Figure 2:
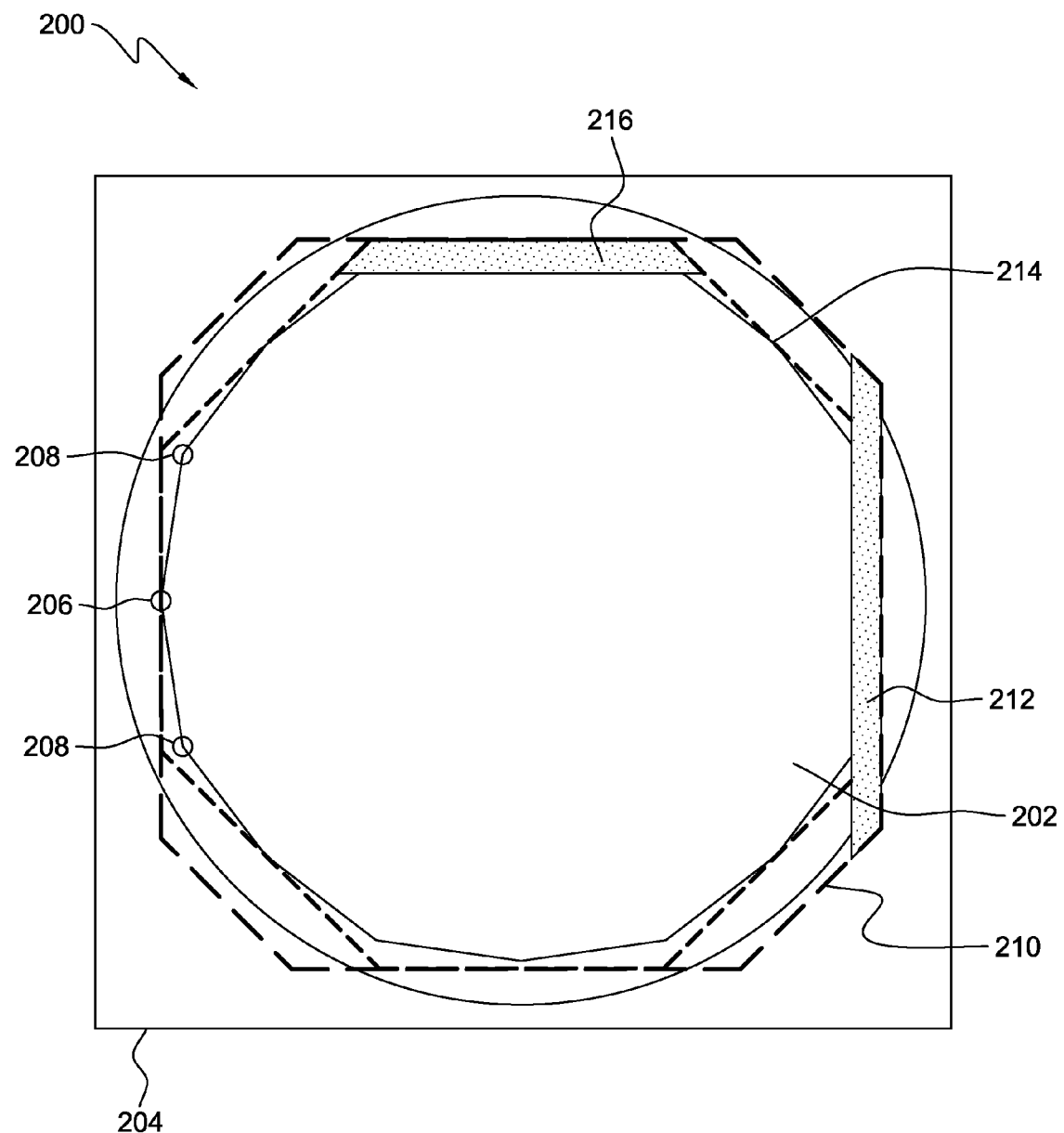
FIG. 2 is an illustration of cross-sections of improved structural designs for a TSV depicted in accordance with an illustrative embodiment, overlaid on a traditional TSV cross-section.

FIG. 2 illustrates cross-sections of improved structural designs for a TSV depicted in accordance with an illustrative embodiment, overlaid on a traditional TSV cross-section. Connection 200 shows an end of a TSV where it abuts a metallization layer 204. Here, connection 200 shows different potential cross-sections the TSV may have at this intersection. A traditional TSV cross-section 202 is substantially circular, causing current to travel into or out of metallization layer 204 at the leading edge 206 of TSV cross-section 202 due to low resistance in the TSV structure. With almost all current traveling through leading edge 206, it may form a void, which will grow over time, eventually cutting off this area of contact. After leading edge 206 loses contact, most of the current flows to new leading points 208, causing the eventual loss of contact in these contact areas as well. Continuing in this fashion, this process may continue until internal failure or open circuit failure, or alternatively increase the resistance as each area becomes disconnected.

By providing a flat edge in the TSV structure where current enters and exits, such as a truncated square cross-section 210 or octagonal cross-section 214, the current is evenly distributed over the length of the edge, as shown in flat edge 212 of the truncated square cross-section 210 and flat edge 216, of octagonal cross-section 214.

Cross-sections 210 and 214 are not intended to be structurally limiting. A person of skill in the art will recognize that even a single flat edge will allow current to flow, with a relatively uniform current density, into or out of that flat edge, and such a design is an embodiment of the present invention. A preferred embodiment would have eight sides such as in cross-sections 210 and 214 to allow wires in metallization layer 204 to contact the TSV structure from eight directions, making the TSV structure more universal.

Although in all embodiments, corners are introduced into the design, in the preferred embodiment, the etch process rounds these corners, keeping the local stresses low.

Figure 3:
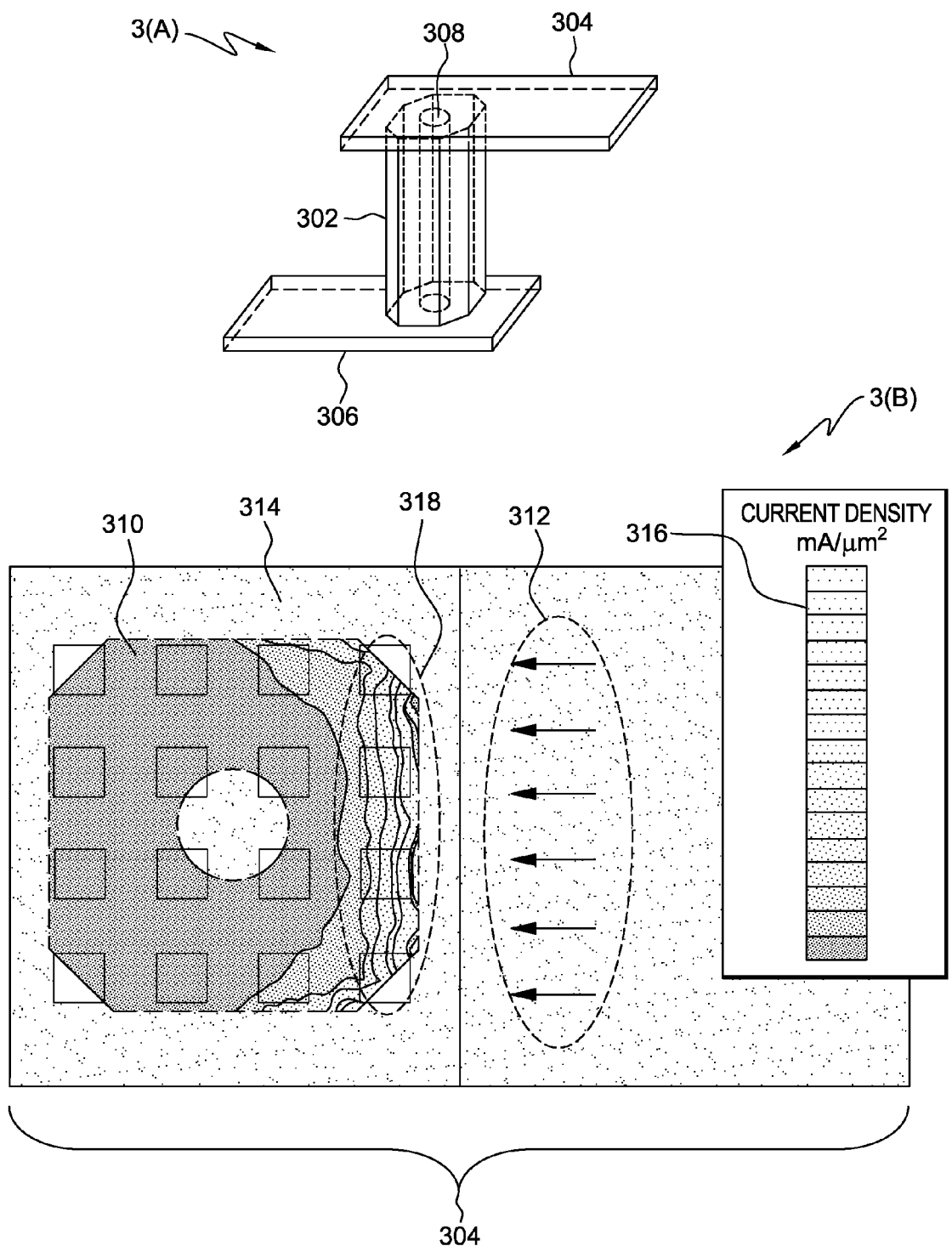
FIG. 3 is an illustration of different views of an improved structural design for a TSV and layout of a contact grid (connecting wires) in accordance with an illustrative embodiment.

FIG. 3 depicts different views of an improved structural design for a TSV and layout of connecting wires in accordance with an illustrative embodiment. View 3(A) offers a three dimensional view of a TSV structure connected to metal layers. View 3(B) shows a cross-sectional view where a metal layer intersects with an end of the TSV structure.

TSV 302 is a TSV structure passing entirely through a semiconductor substrate (not shown). In a preferred embodiment, TSV 302 will be composed of copper (Cu). TSV 302 has eight flat sides, in the shape of a truncated square, which are connected to two planar ends. A person of skill in the art will understand that TSV 302 is only one embodiment of the invention and that a TSV as encompassed by the invention must only have a flat edge where the TSV connects to wires. Other suitable structures include, but are not limited to, two flat sides opposite each other connected by round edges, a TSV structure with a triangular cross-section, a TSV structure with a hexagonal cross-section, a TSV structure with an octagonal cross-section, and a TSV structure with a decagonal cross-section. The connecting edges of TSV 302 are positioned perpendicular to the axis of the connecting metal wires in metallization layers 304 and 306 so that current may flow into and out of TSV 302 uniformly.

Like TSV 102 in FIG. 1, TSV 302 must also connect on both ends to metallization layers, in FIG. 3, metallization layers 304 and 306.

In an illustrative embodiment, TSV 302 contains inner core 308. Inner core 308 is preferably comprised of silicon. In other embodiments, inner core 308 may be hollow, comprised of a conductive composite material, comprised of an insulating material, or comprise some combination of the preceding. In another embodiment, TSV 302 may be completely devoid of inner core 308.

View 3(B) shows TSV cross-section 310 of TSV 302 at the intersection with metallization layer 304 on the device side of the chip. Current 312 flows through metal layer 304, into contact grid 314 and into TSV cross-section 310 from the right. In another embodiment current 312 may instead flow from TSV cross-section 310, into contact grid 314 and into metal layer 304.

Wires in the metallization layer 304 may connect with metal contact grid 314 (when the TSV is not aligned with the current source from another chip or from the connecting substrate). Due to the width of TSV 302, the wiring has a width several times greater than its own thickness. Forming the contacting wire in a mesh pattern allows the wiring to meet any metal density restrictions (also referred to as wire density restrictions and metal coverage restrictions) required for the chemical mechanical polishing (CMP) used to define the metal lines. Such restrictions are used to ensure thickness uniformity in the metallization level, and generally limit to around eighty (80) percent metal coverage or less. Contact grid 314 is designed to meet these requirements and is directly connected to TSV cross-section 310 where TSV cross-section 310 is a planar end of TSV 302 on the device side. Contact grid 314 is patterned to meet metal coverage restrictions, and when placed, effectively becomes part of metallization layer 306.

Current density chart 316 shows higher current densities represented on the top of chart 316, and low current densities represented by the bottom of chart 316. As current 312 enters TSV cross-section 310 from the left, relatively uniform current densities can be seen in area 318.

Figure 4:
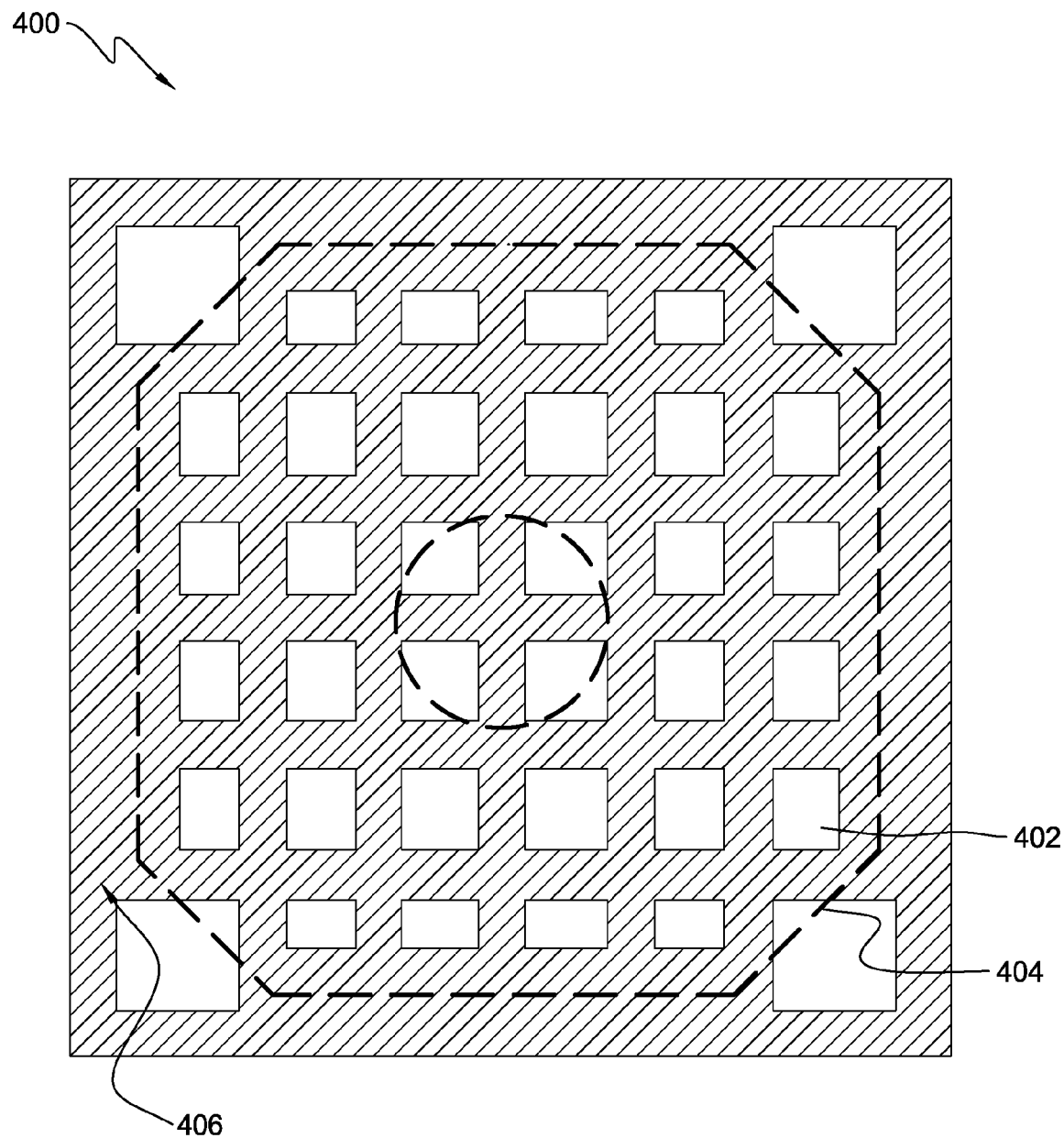
FIG. 4 is an illustration of a contact grid designed to provide greater metal overlap along the flat edges of the TSV structure in accordance with an illustrative environment.

FIG. 4 illustrates an optimized contact grid to provide greater metal overlap along the flat edges of the TSV structure in accordance with an illustrative environment. Connection 400 shows an end portion of an embodiment of an improved TSV structure, such as TSV 302 in FIG. 3, where the end portion connects to an improved contact grid 406.

Here, the end portion of TSV structure 402, is designed so that its cross-section forms a truncated square 404. End portion 402 is overlaid with contact grid 406. Contact grid 406 has been changed, from exemplary contact grid 314 in FIG. 3, to provide greater metal overlap along the flat edges of the TSV structure 402. Here the overlap corresponds to the truncated square design 404. A person of skill in the art will recognize that a similar alternate contact grid would be just as beneficial if TSV structure 402's cross-section formed an equilateral octagon, or other shapes comprising flat edges of intersection. The overlap between contact grid 406 and the flat edge of TSV structure 402 should be greater than or equal to one and one-half times (1.5×) the wire thickness. This allows the wire to collect current over a distance somewhat longer than the thickness of the wire itself, providing a wider transition region for current flowing from a TSV structure such as 402 and into contact grid 406 (and connecting metallization layer) while still conforming to wiring density rules.

Figure 5:
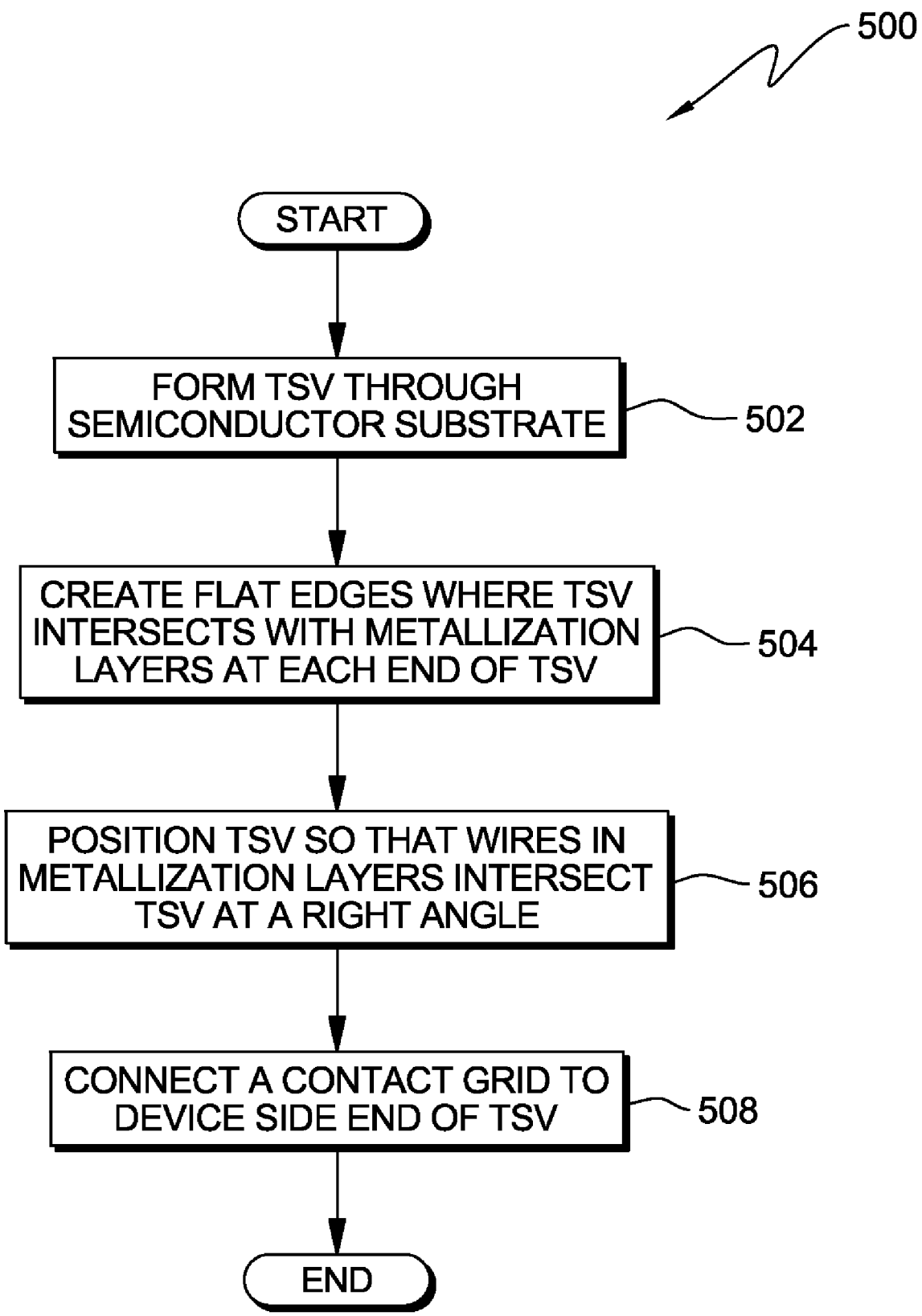
FIG. 5 is an illustration of a process for reducing electromigration in a circuit containing TSVs in accordance with an illustrative embodiment.

FIG. 5 depicts a process for reducing electromigration in a circuit containing TSVs in accordance with an illustrative embodiment.

Process 500 begins by forming a TSV through a semiconductor substrate (502). This process is described in the background. Then process 500 must create flat edges at the intersection of metallization layers and the ends of the TSV (504). In one embodiment, this is accomplished by etching a hole into the substrate with flat sides. When the hole is filled with the conductive material to form the TSV, the resulting TSV has flat sides and hence flat edges where the TSV intersects with metallization layers. Other methods may be used to produce flat edges at the intersection. In the above described embodiment, the intersecting flat edge at the top and the intersecting flat edge at the bottom may be opposite ends of the same flat side of the TSV. In a preferred embodiment, the formed TSV will have eight flat sides, forming a truncated square or an octagon.

Process 500 positions the TSV so that a wire in the metallization layers intersects the flat edge of the TSV at a right angle (506). This ensures that there is no leading edge of the TSV in which current may crowd into when flowing into or out of the TSV, and the current will pass to and from the wire uniformly across the intersection.

Finally process 500, in a preferred embodiment, places a contact grid on the device side of the TSV (508). One or more wires in a metallization layer may connect to the contact grid which meets wire density standards of eighty percent or less metal coverage. In one embodiment, the overlap between an edge wire of the contact grid and the flat edge of the TSV will be greater than or equal to one and one-half times (1.5×) the wire thickness.

The flowchart illustrates one possible implementation of a system and method according to one embodiment of the present invention. It should also be noted that, in some alternative implementations, the steps noted in the flowchart may occur out of the order noted in the figures. For example, two blocks shown in succession may, in fact, be executed substantially concurrently, or the blocks may sometimes be executed in the reverse order, depending upon the functionality involved.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for reducing electromigration in an integrated circuit containing a through-silicon via (TSV), the method comprising the steps of:
    forming a TSV through a semiconductor substrate such that a first end of the TSV is exposed on a device side of the semiconductor substrate, the first end having at least one flat edge, and a second end of the TSV is exposed on a grind side of the semiconductor substrate, the second end having at least one flat edge;
    forming a contact grid on the first end of the TSV, the contact grid comprising a pattern of metal lines, wherein a metal line from the pattern of metal lines runs parallel to and contacts an entire length of the at least one flat edge on the first end and overlaps the at least one flat edge on the first end by at least one and one-half times a thickness of the metal line; and
    forming at least one other metal line on the device side of the semiconductor substrate and connected to the contact grid such that current can pass between the TSV and the at least one other metal line via the contact grid.

2. The method of claim 1, wherein the perimeter of the exposed area has:
    at least two flat edges; and
    wherein the step of etching the exposed area comprises etching the exposed area such that the void comprises at least two planar sides, corresponding to the at least two flat edges, extending into the semiconductor substrate.

3. The method of claim 2, wherein the perimeter of the exposed area has eight flat edges; and
    wherein the step of etching the exposed area comprises etching the exposed area such that the void comprises eight planar sides, corresponding to the eight flat edges, extending into the semiconductor substrate.

4. The method of claim 3, wherein the perimeter of the exposed area forms a truncated square.

5. The method of claim 3, wherein the perimeter of the exposed area consists of eight flat edges equal in length.

6. The method of claim 1, wherein the contact grid is patterned to contain a metal coverage density of no greater than eighty percent.

7. The method of claim 1, wherein the step of forming the TSV through the semiconductor substrate comprises:
    depositing an etch mask on the device side of the semiconductor substrate to expose an area of the semiconductor substrate to a subsequent etch process, the exposed area of the semiconductor substrate having a perimeter with at least one flat edge;
    etching the exposed area through the etch mask to create a void within the semiconductor substrate, wherein, at least at a surface of the device side, the void has a perimeter matching the perimeter of the exposed area with the at least one flat edge;
    depositing at least a conductive material into the void; and
    removing a surface of the grind side to expose the conductive material at the surface of the grind side.

* * * * *